United States Patent
Eberler et al.

(10) Patent No.: US 6,781,378 B2
(45) Date of Patent: Aug. 24, 2004

(54) RADIO-FREQUENCY ANTENNA FOR A MAGNETIC RESONANCE SYSTEM

(75) Inventors: Ludwig Eberler, Postbauer-Heng (DE); Juergen Nistler, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/369,403

(22) Filed: Feb. 19, 2003

(65) Prior Publication Data

US 2003/0178997 A1 Sep. 25, 2003

(30) Foreign Application Priority Data

Feb. 19, 2002 (DE) ......................................... 102 06 905
Dec. 27, 2002 (DE) ......................................... 102 61 214

(51) Int. Cl.$^7$ ................................................. G01V 3/00
(52) U.S. Cl. ....................................... 324/318; 600/422
(58) Field of Search ................................ 324/318, 322, 324/300, 306, 307, 309, 314; 600/421, 422

(56) References Cited

U.S. PATENT DOCUMENTS

| | | |
|---|---|---|
| 4,736,161 A | 4/1988 | Prevot et al. |
| 5,321,360 A * | 6/1994 | Mansfield .................... 324/322 |
| 6,060,883 A | 5/2000 | Knüttel |
| 6,133,733 A | 10/2000 | Lurie et al. |
| 6,452,393 B1 * | 9/2002 | Allen et al. .................. 324/318 |
| 6,466,018 B1 * | 10/2002 | Dumoulin et al. .......... 324/318 |

FOREIGN PATENT DOCUMENTS

| | | |
|---|---|---|
| EP | 0 758 091 | 2/1997 |
| JP | 1132367 | 5/2001 |

OTHER PUBLICATIONS

U.S. patent application Publication No. 2002/0011843.

* cited by examiner

*Primary Examiner*—Louis Arana
(74) *Attorney, Agent, or Firm*—Schiff Hardin LLP

(57) ABSTRACT

A radio-frequency antenna for a magnetic resonance system has a number of antenna rods and two end rings. The antenna rods are regularly arranged around an antenna axis and are connected at their respective rod ends to the end rings. When the antenna rods proceed essentially parallel to the antenna axis, they have a rod spacing in their middle region from the antenna axis that is smaller than a end ring spacing that at least one of the end rings exhibits from the antenna axis. When the antenna rods form an angle of inclination with the antenna axis, they have a rod spacing from the antenna axis at their end lying closer to the antenna axis that is smaller than an end ring spacing exhibited by the end ring that is connected to that rod end. In both version, rod spacing lies between 25 and 35 cm and is between 5 and 15 mm smaller than the end ring spacing.

38 Claims, 7 Drawing Sheets

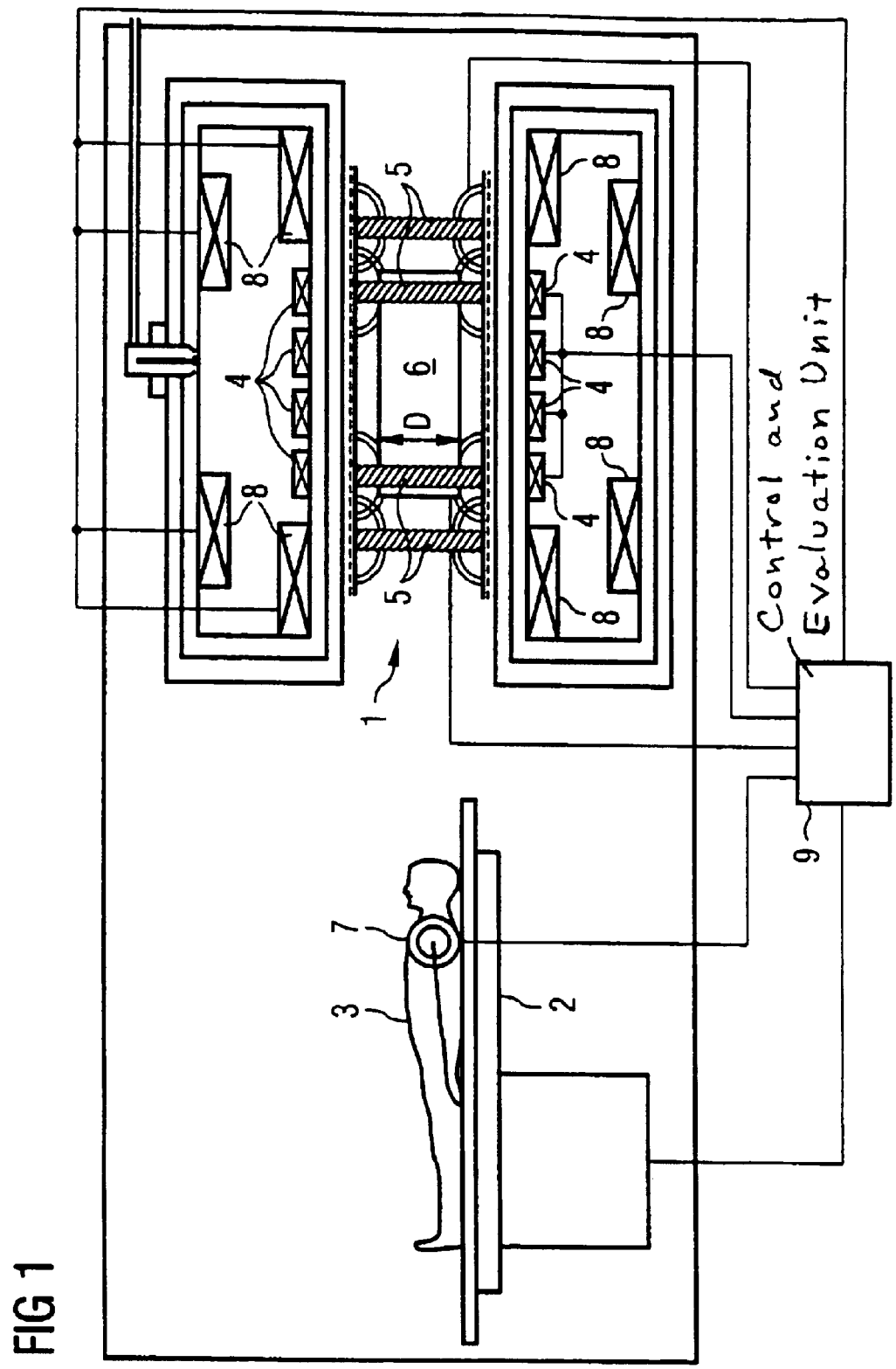

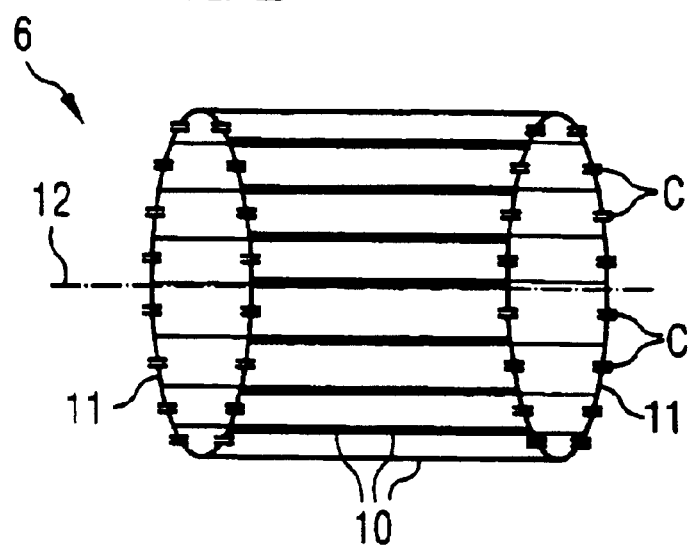
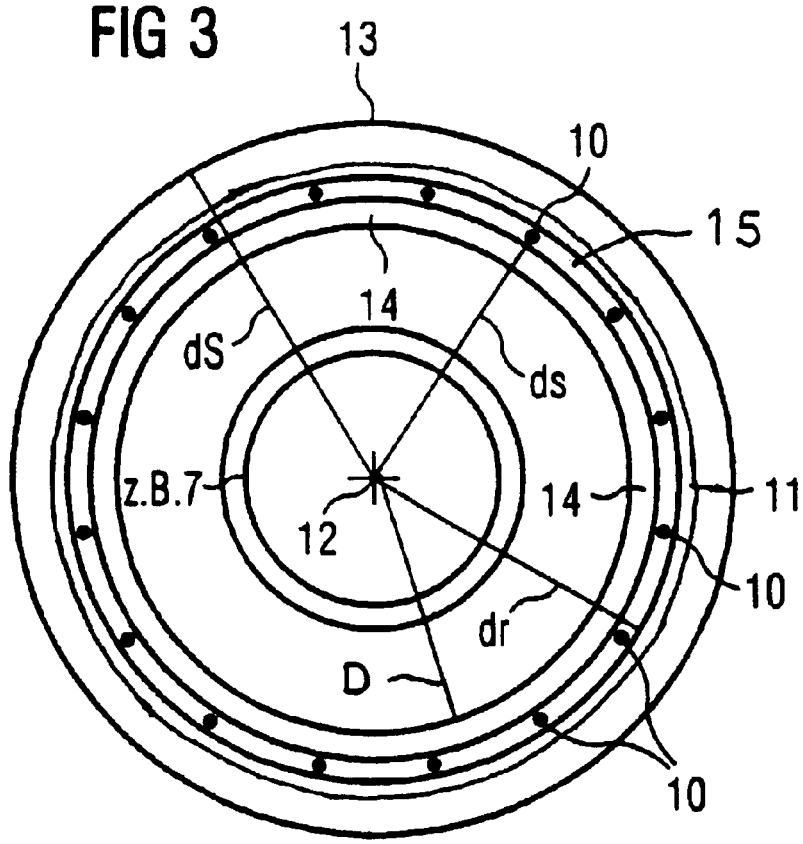

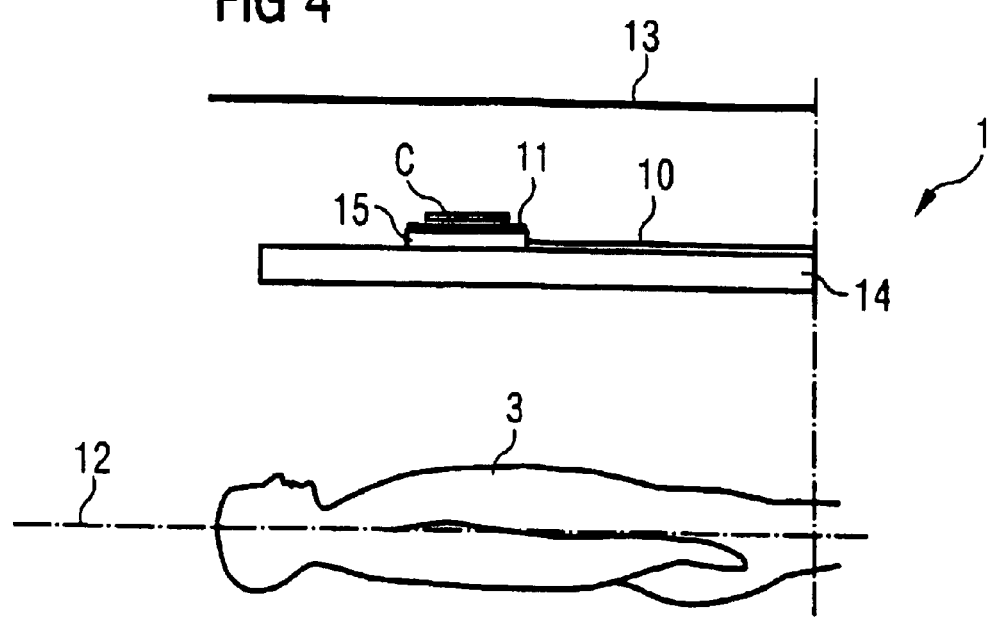
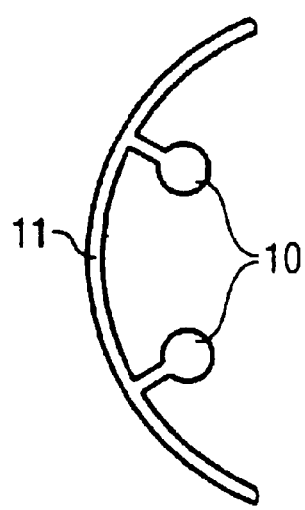
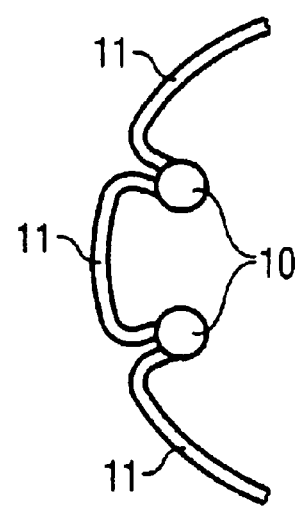

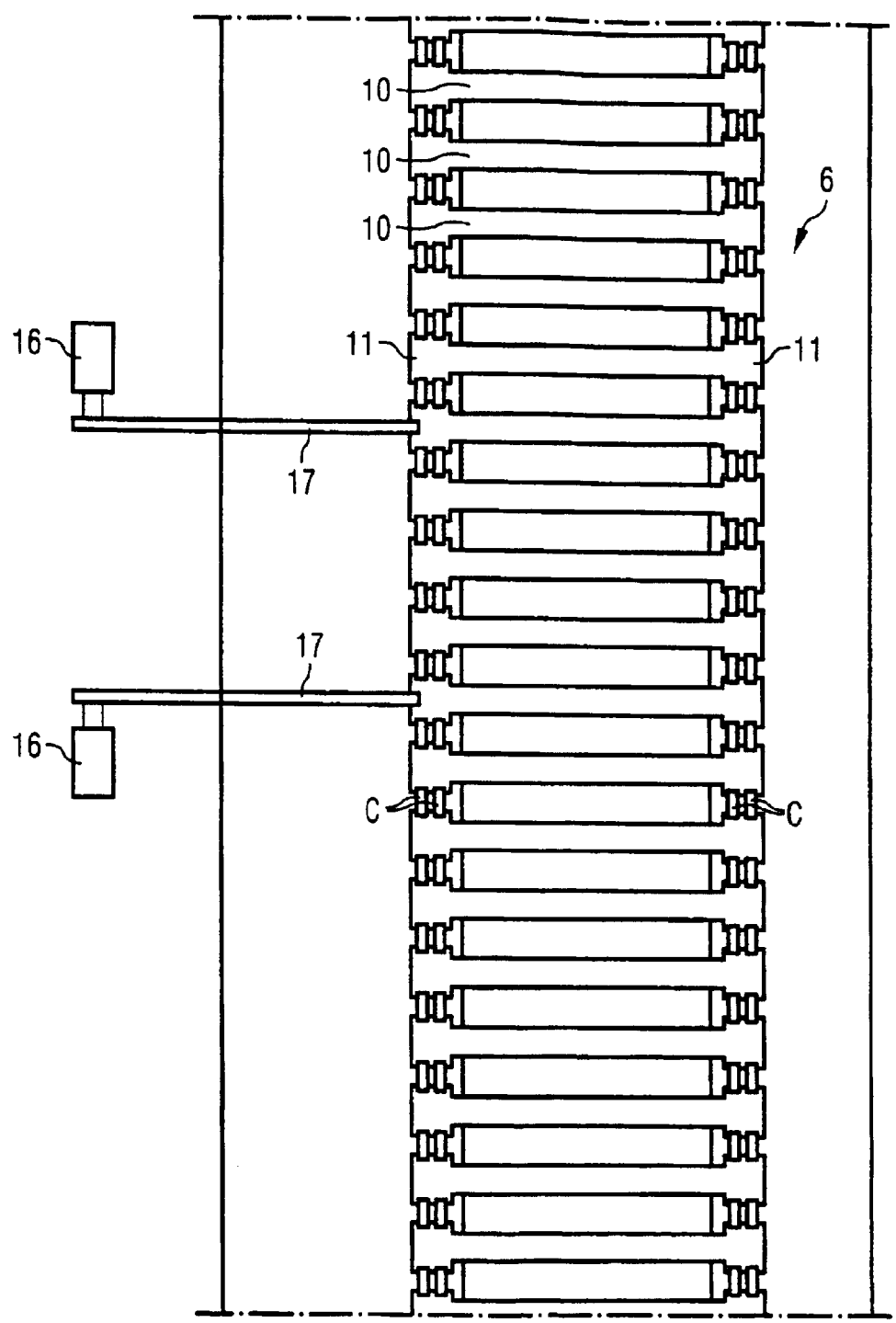

Circle on which rods 10 lie

RADIO-FREQUENCY ANTENNA FOR A MAGNETIC RESONANCE SYSTEM

BACKGROUND OF THE INVENTION

1. Field of the Invention

The present invention is directed to a radio-frequency antenna for a magnetic resonance system having a number of antenna rods and two end rings of the type wherein the antenna rods are regularly spaced around an antenna axis and are connected at their respective rod ends to the end rings.

2. Description of the Prior Art

In an antenna of the above type, the antenna rods can be arranged in different ways. Each antenna rod can proceed essentially parallel to the antenna axis and have a rod spacing in a middle region of the antenna axis that is smaller than a end ring spacing that at least one of the end rings exhibits from the antenna axis in the region of this antenna rod. Alternatively, each antenna rod can form an angle of inclination with the antenna axis and have a rod spacing from the antenna axis at its end lying closer to the antenna axis that is smaller than the end ring spacing exhibited by the end ring that is connected to that rod end, in this region of this antenna rod.

Such radio-frequency antennas are generally known as birdcage resonators, particularly when the antenna rods are parallel to the antenna axis. Capacitors are arranged in the end rings and/or in the antenna rods in these. The radio-frequency antenna is tuned such that it forms a resonant circuit at a predefined or predefinable operating frequency of the radio-frequency antenna. German PS 197 32 783 is an example of such an arrangement. A similar disclosure can be derived from JP-A2000 166 895.

Nuclear spins of an examination subject (often a human being) are excited into resonance due to the magnetic fields emitted by such a radio-frequency antenna. The resonant signals are then acquired and interpreted. The acquisition of the resonance signals can potentially ensue with the same antenna.

At least one whole-body antenna is present in a magnetic resonance system. The rod spacing therein usually lies between 25 and 35 cm. Other components are usually present. These particularly include local coils. Local coils are employed in order to achieve a noticeably improved signal-to-noise ratio in the imaging than with a global or whole-body antenna. Local coils for the head or extremity examination of a human are often constructed according to the same principle as whole-body antennas. A relatively strong coupling of the antennas, and thus a deterioration of the signal-to-noise ratio, occurs due to this fact, namely the geometrically similar structure.

In order to keep the coupling of the antennas within limits, the whole-body antenna is detuned in the case of reception by the local coil or coils. To this end, detuning circuits that deactivate the whole-body antenna as warranted are installed in the whole-body antenna. For example, the deactivation can be achieved with diode switches that short the capacitors and thus shift the resonant frequency of the radio-frequency antenna. At least eight detuning switches in the antenna are required for this purpose in the case of a conventional radio-frequency antenna having, for example, sixteen antenna rods.

Further, the patient is irradiated with a high-frequency magnetic field during the examination. The patient thus absorbs radio-frequency power. Although the power absorbed by the patient is monitored, only the globally absorbed power averaged over the weight of the patient can be identified. Significantly, higher electrical and magnetic fields locally, particularly in regions wherein the patient extends very close to the radio-frequency antenna in the transmission case, so that higher power absorption can occur locally.

SUMMARY OF THE INVENTION

An object of the present invention is to provide a radio-frequency antenna of the type suitable for magnetic resonance systems with which interactions of the radio-frequency antenna with other antennas are reduced and unacceptable heating of the patient is avoided.

In a whole-body antenna (i.e. an antenna wherein the rod spacing lies between 25 and 35 cm), this object is achieved in an antenna of the initially-described type wherein the difference between the end ring spacing and the rod spacing lies between 5 and 15 mm.

The inductance of the appertaining end ring becomes lower by increasing the end ring spacing or spacings. The detuning elements therefore function better since their impedance is transformed to a lower-impedance at the influencing location. The appertaining end ring is also at a geometrically greater distance from the structures of the local coils.

By avoiding any increased end ring spacings in the local coil, the coupling due to geometrically similar structures is reduced. The signal-to-noise ratio of the local coils thus is reduced to only a very slight degree.

Moreover, the appertaining end ring is then at a greater distance from the patient. The magnetic fields that are generated by currents in the end ring are thus lower. A localized absorption of radio-frequency power in the patient is reduced.

Due to the lower inductance of the end ring larger capacitances are required in order to set the same resonant frequency. The electrical fields that the capacitors exhibit thus also are reduced. A reduction of the local absorption of the radio-frequency power in the patient also occurs as a result.

The above measures become more pronounced the greater the end ring spacing is compared to the rod spacing.

Preferably, the antenna rods and the end rings are radially surrounded by a radio-frequency shield at the exterior.

As a rule, the radio-frequency shield has a shield spacing from the antenna axis in the region of the antenna rod under consideration. An especially good effect due to the increase in the end ring spacing is achieved when the difference between the end ring spacing and the rod spacing amounts to at least 15%, preferably 20 through 40%, of the difference between the shield spacing and the rod spacing.

The radio-frequency shield can be symmetrically or asymmetrically arranged relative to the antenna axis.

The outlay for the detuning of the radio-frequency antenna also can be reduced due to the lowering of the appertaining end ring. In particular, it suffices when the radio-frequency antenna still has only (exactly) two detuning circuits with which the radio-frequency antenna can be detuned.

Conventionally, the detuning circuits are installed into the radio-frequency antenna itself. In particular, they are arranged in the connecting regions of the end rings to the antennas rods. In the inventive radio-frequency antenna, in contrast, it is possible for the detuning circuits to be connected to the feed cable for the radio-frequency antenna.

When the radio-frequency antenna is mounted on the exterior of a carrying tube, then the structural arrangement of the individual components of the radio-frequency antenna can be realized in an especially simple way.

In an embodiment wherein the antenna rods form at least two sub-structures that are rotated relative to one another, each of the sub-structures is regularly arranged around the antenna axis and the sub-structures comprise rod spacings that differ from one another. The radio-frequency antenna that is optimized even further.

As a rule, the antenna rods or the sub-structures are circularly arranged around the antenna axis. Alternatively, they can be arranged elliptically, for example, around the antenna axis.

The end rings are usually symmetrically arranged relative to the antenna axis. Alternatively, they can be asymmetrically arranged relative to the antenna axis.

The connection of the antenna rods to the one end ring or to the end rings can be effected by the antenna rods proceeding radially outwardly toward the appertaining rod end given an essentially parallel course of the antenna rods relative to the antenna axis, the antenna rods can be alternatively bent radially outwardly in the region of their rod ends or can proceed gradually radially outwardly from the middle region toward the rod ends.

Alternatively, the connection of the antenna rods to the one end ring or to the end rings is effected by the appertaining end ring being conducted radially inward in its connecting region to the antenna rods.

DESCRIPTION OF THE DRAWINGS

FIG. 1 is a sectional, schematic illustration of a magnetic resonance system.

FIG. 2 shows an inventive radio-frequency antenna in perspective.

FIG. 3 shows the radio-frequency antenna of FIG. 2 in a plan view.

FIG. 4 shows the radio-frequency antenna of FIG. 2 from the side.

FIG. 5 shows the radio-frequency antenna of FIG. 2 in an unrolled illustration.

FIGS. 6–7 show alternative embodiments for connecting an end ring to an antenna rod in accordance with the invention.

DESCRIPTION OF THE PREFERRED EMBODIMENTS

Figure 8:
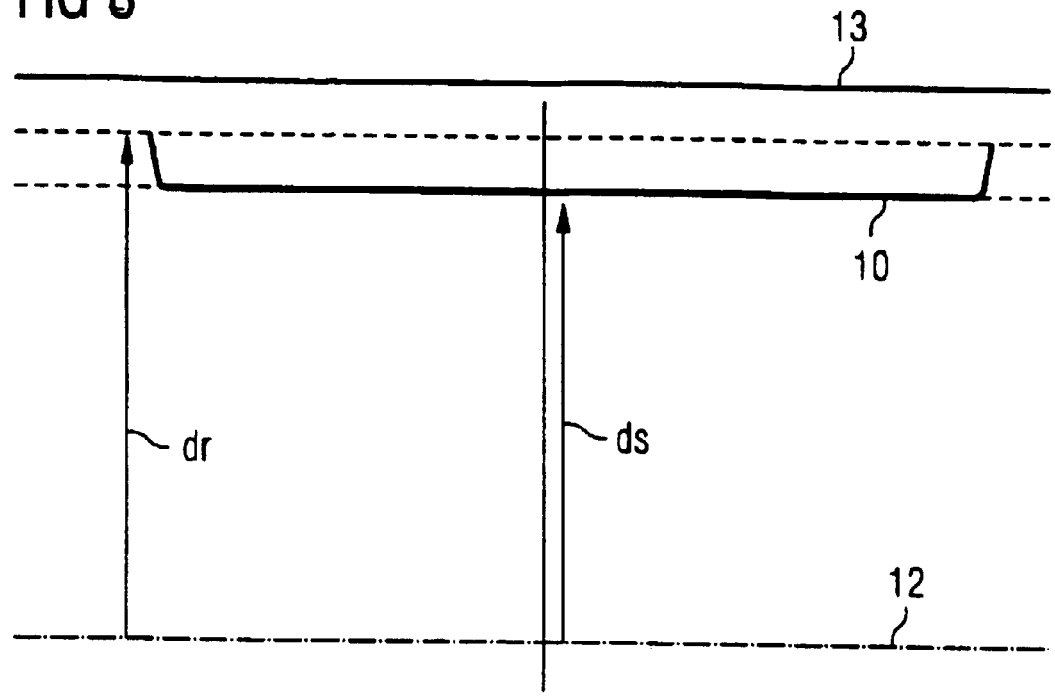
FIGS. 8–9 show different embodiments for connecting rods in accordance with the invention.

As shown in FIG. 1, a magnetic resonance system has an examination space 1. A human or other patient 3 (generally: an examination subject 3) can be introduced into the examination space 1 by means of a patient bed 2. The examination space 1 usually is essentially cylindrical, and ahs an inside diameter D.

The examination space 1 is surrounded by various magnets and magnet systems. These include a basic field magnet 4. The basic field magnet 4 serves the purpose of generating a uniform basic magnetic field. A gradient magnet system 5 is also present. The gradient magnet system 5 generates gradient fields that are required for generating meaningfully interpretable magnetic resonance signals. The magnet system also has a whole-body coil 6 built into it. The whole-body coil 6 is fashioned as radio-frequency antenna 6. During operation as a transmission antenna, it serves for exciting magnetic resonance signals in the examination subject 3. During operation as a reception antenna, it serves for the reception of the excited magnetic resonance signals of the examination subject 3.

At least one local coil 7 usually also can be introduced into the interior of the examination space 1, fashioned as a radio-frequency antenna. The local coil 7 usually serves for the local reception of magnetic resonance signals that previously excited with the whole-body coil 6. On a case-by-case basis, however, the local coil 7 also can be operated as a transmission antenna, just like the whole-body coil 6.

The basic field magnet 4, the gradient magnet system 5 and the coils 6, 7, are surrounded by a shielding magnet 8.

The gradient magnet system 5 and the coils 6, 7 are connected to a control and evaluation unit 9. In a known way, this suitably drives the gradient magnet system 5 and the coils 6, 7 in order to excite, receive and evaluate magnetic resonance signals.

As shown in FIG. 2, the radio-frequency antenna 6 has a number of antenna rods 10 as well as two end rings 11. Further, capacitors C with which the radio-frequency antenna 6 is tuned to a specific operating frequency are arranged in the antenna rods 10 and/or in end rings 11. These capacitors C are arranged in the end rings 11 according to FIG. 2. The end rings 11 are thus composed of end ring segments, however, this is of secondary importance in the context of the present invention.

In the embodiment according to FIG. 2, the antenna rods 10 proceed parallel to an antenna axis 12. As shown in FIG. 3, the antenna rods 10 are arranged uniformly distributed around the antenna axis 12 in a rod spacing ds from the antenna axis 12. The rod spacing ds is the same for all antenna rods 10.

The rod spacing ds is larger by a small amount than half the diameter D of the examination space 1. The rod spacing ds usually ranges between 25 and 35 cm.

At each end, the antenna rods 10 are each connected to an end ring 11. The end rings 11 thus are arranged concentric to the antenna axis 12.

The end rings 11 each exhibit an end ring spacing dr from the antenna axis 12 that are larger than the rod spacing ds. According to FIG. 3, the end ring spacings dr of both end rings 11 are thereby greater than the rod spacing ds. Fundamentally, however, it would suffice if the end ring spacing dr for only one of the end rings were larger than the rod spacing ds. The end ring spacing dr is preferably at least 5 mm greater than the rod spacing ds, such as 10 to 15 mm greater.

As can be seen from FIG. 3, the antenna rods 10 and the end rings 11 are radially surrounded by a radio-frequency shield 13 at the exterior. The radio-frequency shield 13 proceeds concentrically around the antenna axis 12 at a shield spacing dS. In the region of the antenna rods 10, thus, the radio-frequency shield 13 always exhibits the same shield spacing dS. The difference between the shield spacing dS and the rod spacing ds typically lies between 25 and 25 mm, for example 30 mm. The difference between the end ring spacing dr and the rod spacing ds should be at least 15%, preferably 20 through 40%, of the difference of the shield spacing dS and the rod spacing ds. Given a spacing of 25/30/35 mm of the radio-frequency shield 13 from the antenna rods, the radial spacing of the end rings 11 from the antenna rods 10 thus amounts to at least 3.75/4.50/5.25 mm, preferably 5/6/7 through 10/12/14 mm.

As can be clearly seen from FIGS. 3 and 4, the antenna rods 10 and the end rings 11 are mounted at the exterior of a carrying tube 14 (which is cylindrical here). The carrying pipe 14 corresponds to the inside wall of the examination space 1. The increased spacing of the end rings 11 from the rod axis 12 can be particularly assured by a separate spacer 15 placed onto the carrying tube 4. The spacer 15 preferably is composed of a thermally insulating material, for example expanded polyurethane.

As shown in FIG. 5, the radio-frequency antenna 6 has exactly two detuning circuits 16 that are connected to feed cables 17 for the radio-frequency antenna 6. The detuning circuits 16 are fashioned, for example, as capacitor networks that are connectable to the feed cables 17 via diode switches. Thus, detuning of the radio-frequency antenna 6 is possible by connecting the detuning circuits 16 to the feed cables 17.

As shown in FIG. 6, the connection of the antenna rods 10 to the end rings 11 can be effected by the antenna rods 10 proceeding radially outwardly toward their rod ends. Alternatively, as shown in FIG. 7, the connection of the antenna rods 10 to the end rings 11 can be effected by the end rings 11 proceeding radially inwardly at connecting regions to the antenna rods 10.

Figure 9:
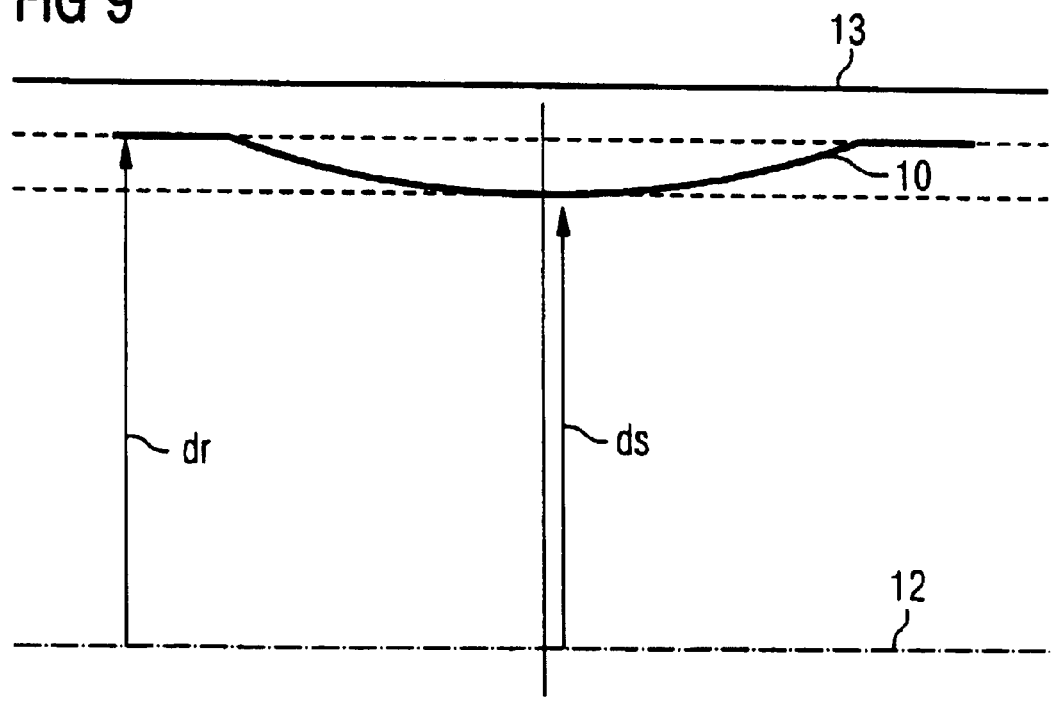

The antenna rods can proceed radially outwardly toward their rod ends in two ways that can be utilized as alternatives or combined. As shown in FIG. 8, the antenna rods 10 can be bent radially outwardly in the regions of the rod ends. In this case, the bending ensues over the last 10%, particularly over the last 5%, before the rod end, with respect to the entire length of an antenna rod 10. As shown in FIG. 9, the antenna rods 10 can proceed gradually radially outwardly from the middle region toward the rod ends. In this case, the gradual radially outward course extends over at least 20%, preferably 30 through 35%, of the overall length of an antenna rod 10. In this case, preferably no additional radial increase toward the outside ensues in the outermost 10% of each antenna rod 10.

In each of the versions described above, particularly with regard to the illustrations in FIGS. 2, 8 and 9, each antenna rod 10 proceeds essentially parallel to the antenna axis 12. In its middle region, it exhibits the rod spacing ds from the antenna axis 12.

Figure 10:
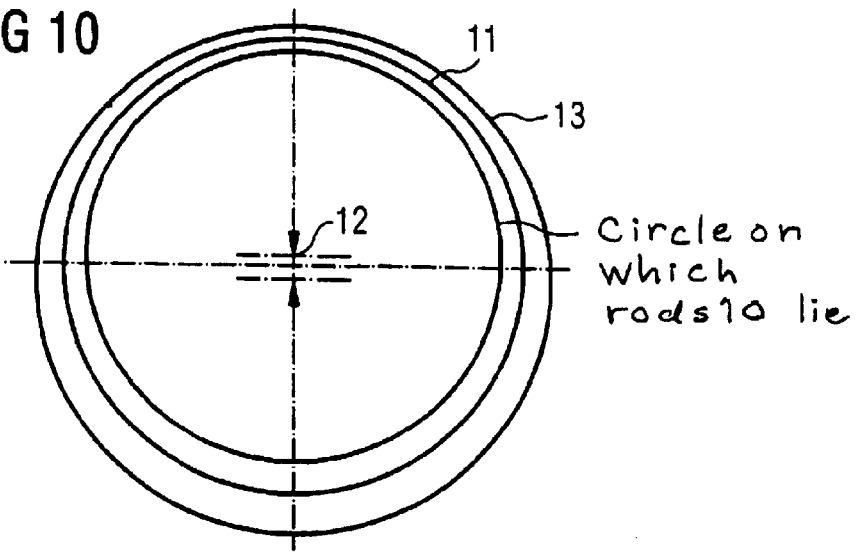
FIG. 10 shows another embodiment of an inventive radio-frequency antenna in a plan view.

As particularly shown in FIGS. 2 and 3 and as was assumed, moreover, in conjunction with FIGS. 8 and 9, the antenna rods 10 usually are circularly arranged around the antenna axis 12. The end rings 11 and the radio-frequency shield 12 also are usually symmetrically arranged relative to the antenna axis 12. According to FIG. 10, however, it is also possible for one of the end rings 11 (or both end rings 11) and/or the radio-frequency shield 13 to be asymmetrically arranged relative to the antenna axis 12. An asymmetrical arrangement of the radio-frequency shield 13 can be realized independently from an asymmetrical arrangement of one of the end rings 11, or of both end rings 11.

Figure 11:
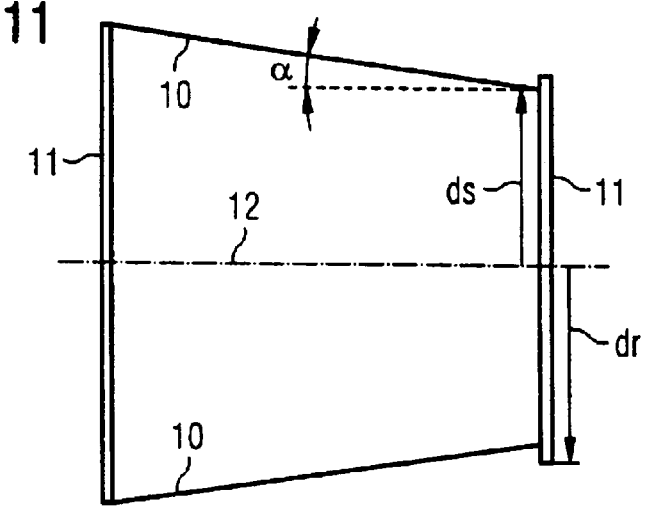
FIG. 11 shows another embodiment of an inventive radio-frequency antenna from the side.

As shown in FIG. 11, it is also possible to fashion the radio-frequency antenna as a conical frustum instead of as a cylinder. In this case, the antenna rods 10 describe an angle of inclination a with the antenna axis. Accordingly, each antenna rod 10 has one rod end that lies closer to the antenna axis than the other rod end. In this case, the rod spacing ds is the spacing of this rod end, i.e. the rod end lying closer to the antenna axis 12, from the antenna axis 12. In this case, this rod spacing ds is smaller than the end ring spacing dr from the antenna axis 12 of the end ring 11 that is connected to this rod end.

Figure 12:
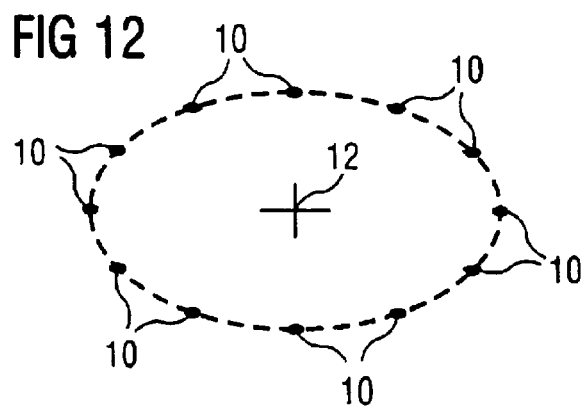
FIGS. 12–14 respectively show further embodiments of the inventive radio-frequency antenna in plan view.

As can be seen from FIG. 12, the arrangement of the antenna rods 10 need not necessarily be circular. It suffices for the antenna rods 10 to be regularly arranged around the antenna axis 12. As can be seen from FIG. 12, for example, the antenna rods 10 can be elliptically arranged around the antenna axis 12. As a result, fields, for example in the shoulder region of the patient 3, that are locally smaller than in the chest or back region of the patient 3, can be generated. The usage degree (coverage) of the antenna thus can be increased without increasing the radio-frequency load on the patient 3.

Figure 13:
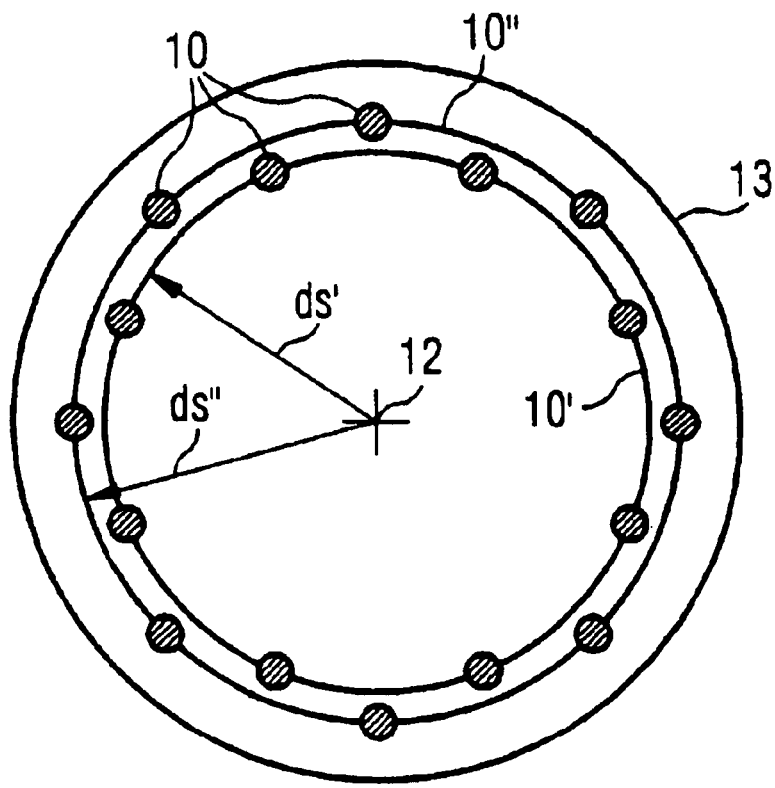

As shown in FIG. 13, it is also possible for the antenna rods 10 to form two sub-structures 10', 10" that are rotated (offset) relative to one another with respect to the antenna axis 12. In this case, each of the sub-structures 10', 10" is regularly arranged around the antenna axis 12. In this case, the sub-structures 10', 10" have respective rod spacings ds', ds" that differ from one another. Preferably they are arranged mismatched relative to one another.

Figure 14:
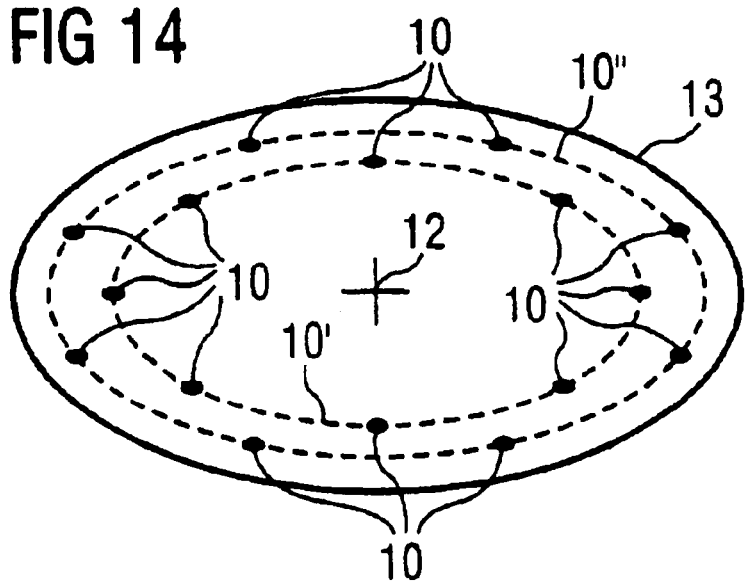

In an embodiment of FIG. 13, the sub-structures 10', 10" are circularly arranged around the antenna axis 12, however, as described above it is only necessary that they be distributed in a regular arrangement. In particular, an elliptical arrangement—see FIG. 14—is again possible.

The stated objectives can be achieved with the inventive radio-frequency antenna in a simple way without deteriorating the homogeneity of the generated radio-frequency field.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency antenna for a magnetic resonance system comprising:

a plurality of antenna rods regularly disposed around a central antenna axis, each of said antenna rods having opposite rod ends and a middle region disposed between said rod ends;

two end rings, the respective rod ends of each of said antenna rods being connected to said end rings;

each of said antenna rods proceeding between said end rings substantially parallel to said antenna axis and exhibiting a rod spacing from said antenna axis in said middle region that is smaller than an end ring spacing from said antenna axis exhibited by at least one of said end rings in a region of that antenna rod;

said rod spacing being in a range between 25 and 35 cm; and a difference between end ring spacing and said rod spacing being between 5 and 15 mm.

2. A radio-frequency antenna as claimed in claim 1 further comprising a radio-frequency shield radially surrounding said antenna rods and said end rings.

3. A radio-frequency antenna as claimed in claim 2 wherein said radio-frequency shield exhibits a shield spacing from said antenna axis, and wherein, for each of said antenna rods, a difference between the end ring spacing and the rod spacing is at least 15% of a difference between said shield spacing and said rod spacing.

4. A radio-frequency antenna as claimed in claim 3 wherein said difference between said end ring spacing and said rod spacing is in a range between 20 through 40% of said difference between said shield spacing and said rod spacing.

5. A radio-frequency antenna as claimed in claim 2 wherein said radio-frequency shield is symmetrically disposed relative to said antenna axis.

6. A radio-frequency antenna as claimed in claim 2 wherein said radio-frequency shield is asymmetrically disposed relative to said antenna axis.

7. A radio-frequency antenna as claimed in claim 1 wherein said antenna rods and said end rings form a conductor arrangement and wherein said radio-frequency further comprises exactly two detuning circuits connected to said conductor arrangement.

8. A radio-frequency antenna as claimed in claim 7 further comprising feed cables connecting said detuning circuits to said conductor arrangement.

9. A radio-frequency antenna as claimed in claim 1 wherein said antenna rods and said end rings form a conductor arrangement, and wherein said radio-frequency antenna further comprises a carrying tube having an exterior on which said conductor arrangement is mounted.

10. A radio-frequency antenna as claimed in claim 1 wherein said antenna rods form at least two sub-structures that are offset relative to each other around said antenna axis, said at least two sub-structures respectively containing different ones of said antenna rod regularly disposed around said antenna axis, with the antenna rods in the respective substructures having rod spacings which differ from sub-structure to sub-structure.

11. A radio-frequency antenna as claimed in claim 10 wherein the antenna rods in each of said sub-structures are circularly disposed around said antenna axis.

12. A radio-frequency antenna as claimed in claim 10 wherein the antenna rods in each of said sub-structures are elliptically disposed around said antenna axis.

13. A radio-frequency antenna as claimed in claim 1 wherein said antenna rods are circularly disposed around said antenna axis.

14. A radio-frequency antenna as claimed in claim 1 wherein said antenna rods are elliptically disposed around said antenna axis.

15. A radio-frequency antenna as claimed in claim 1 wherein said end rings are symmetrically disposed relative to said antenna axis.

16. A radio-frequency antenna as claimed in claim 1 wherein said end rings as asymmetrically disposed relative to said antenna axis.

17. A radio-frequency antenna as claimed in claim 1 wherein each of said antenna rods is bent radially outwardly toward at least one rod end for connecting said at least one rod end to one of said end rings.

18. A radio-frequency antenna as claimed in claim 17 wherein each of said antenna rods is bent radial outwardly only at said at least one rod end with substantially no bending in said middle region.

19. A radio-frequency antenna as claimed in claim 17 wherein each of said antenna rods is bent radially outwardly toward said at least one rod end by a gradual bending proceeding from said middle region toward said at least one rod end.

20. A radio-frequency antenna as claimed in claim 1 wherein said antenna rods are connected to at least one of said end rings by a plurality of radially inward projections of said at least one end ring proceeding respectively to said antenna rods.

21. A radio-frequency antenna for a magnetic resonance system comprising:

a plurality of antenna rods regularly disposed around a central antenna axis, each of said antenna rods having opposite rod ends and a middle region disposed between said rod ends;

two end rings, the respective rod ends of each of said antenna rods being connected to said end rings;

each of said antenna rods being oriented at an angle of inclination relative to said antenna axis so as to have one rod end disposed closer to said antenna axis, and wherein, for each of said antenna rods, a rod spacing of said one rod end from said antenna axis is smaller than an end ring spacing from said antenna axis of one of said end rings connected to said one rod end, in a region of that antenna rod;

said rod spacing being in a range between 25 and 35 cm; and a difference between end ring spacing and said rod spacing being between 5 and 15 mm.

22. A radio-frequency antenna as claimed in claim 21 further comprising a radio-frequency shield radially surrounding said antenna rods and said end rings.

23. A radio-frequency antenna as claimed in claim 22 wherein said radio-frequency shield exhibits a shield spacing from said antenna axis, and wherein, for each of said antenna rods, a difference between the end ring spacing and the rod spacing is at least 15% of a difference between said shield spacing and said rod spacing.

24. A radio-frequency antenna as claimed in claim 23 wherein said difference between said end ring spacing and said rod spacing is in a range between 20 through 40% of said difference between said shield spacing and said rod spacing.

25. A radio-frequency antenna as claimed in claim 22 wherein said radio-frequency shield is symmetrically disposed relative to said antenna axis.

26. A radio-frequency antenna as claimed in claim 22 wherein said radio-frequency shield is asymmetrically disposed relative to said antenna axis.

27. A radio-frequency antenna as claimed in claim 21 wherein said antenna rods and said end rings form a conductor arrangement and wherein said radio-frequency further comprises exactly two detuning circuits connected to said conductor arrangement.

28. A radio-frequency antenna as claimed in claim 27 further comprising feed cables connecting said detuning circuits to said conductor arrangement.

29. A radio-frequency antenna as claimed in claim 21 wherein said antenna rods and said end rings form a conductor arrangement, and wherein said radio-frequency antenna further comprises a carrying tube having an exterior on which said conductor arrangement is mounted.

30. A radio-frequency antenna as claimed in claim 21 wherein said antenna rods form at least two sub-structures that are offset relative to each other around said antenna axis, said at least two sub-structures respectively containing different ones of said antenna rod regularly disposed around said antenna axis, with the antenna rods in the respective substructures having rod spacings which differ from sub-structure to sub-structure.

31. A radio-frequency antenna as claimed in claim 30 wherein the antenna rods in each of said sub-structures are circularly disposed around said antenna axis.

32. A radio-frequency antenna as claimed in claim 30 wherein the antenna rods in each of said sub-structures are elliptically disposed around said antenna axis.

33. A radio-frequency antenna as claimed in claim 21 wherein said antenna rods are circularly disposed around said antenna axis.

34. A radio-frequency antenna as claimed in claim 21 wherein said antenna rods are elliptically disposed around said antenna axis.

35. A radio-frequency antenna as claimed in claim 21 wherein said end rings are symmetrically disposed relative to said antenna axis.

36. A radio-frequency antenna as claimed in claim 21 wherein said end rings as asymmetrically disposed relative to said antenna axis.

37. A radio-frequency antenna as claimed in claim 21 wherein each of said antenna rods is bent radially outwardly toward at least one rod end for connecting said at least one rod end to one of said end rings.

38. A radio-frequency antenna as claimed in claim 21 wherein said antenna rods are connected to at least one of said end rings by a plurality of radially inward projections of said at least one end ring proceeding respectively to said antenna rods.

* * * * *